United States Patent
Ono et al.

(10) Patent No.: US 12,004,344 B2
(45) Date of Patent: Jun. 4, 2024

(54) METHOD OF REDUCING WRAP IMPARTED TO SILICON WAFER BY SEMICONDUCTOR LAYERS

(71) Applicant: SUMCO CORPORATION, Tokyo (JP)

(72) Inventors: Toshiaki Ono, Tokyo (JP); Bong-Gyun Ko, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 307 days.

(21) Appl. No.: 17/541,767

(22) Filed: Dec. 3, 2021

(65) Prior Publication Data
US 2022/0093624 A1    Mar. 24, 2022

Related U.S. Application Data

(63) Continuation of application No. 16/619,143, filed as application No. PCT/JP2018/021721 on Jun. 6, 2018, now abandoned.

(30) Foreign Application Priority Data

Jul. 10, 2017   (JP) .................................. 2017-134918

(51) Int. Cl.
    *H10B 41/20*     (2023.01)
    *H01L 21/02*     (2006.01)
    *H10B 41/35*     (2023.01)

(52) U.S. Cl.
CPC ............. *H10B 41/20* (2023.02); *H10B 41/35* (2023.02); *H01L 21/02164* (2013.01);
(Continued)

(58) Field of Classification Search
CPC ......... H01L 27/11551; H01L 27/11524; H01L 21/02002; H10B 41/20; H10B 41/35
See application file for complete search history.

(56) References Cited

U.S. PATENT DOCUMENTS

| 9,312,270 B2 * | 4/2016 | Jang ....................... H10B 99/00 |
| 2006/0292822 A1 | 12/2006 | Xie |

(Continued)

FOREIGN PATENT DOCUMENTS

| CN | 101203943 A | 6/2008 |
| CN | 105448666 A | 3/2016 |

(Continued)

OTHER PUBLICATIONS

Hu, (Stress-related problems in silicon technology, J. Appl. Phys. 70, R53-R80 (1991), available at https://pubs.aip.org/aip/jap/article/70/6/R53/177214/Stress-related-problems-in-silicon-technology, a copy of which is attached.) (Year: 1991).*

(Continued)

*Primary Examiner* — Antonio B Crite
*Assistant Examiner* — Tenley H Schofield
(74) *Attorney, Agent, or Firm* — Greenblum & Bernstein, P.L.C.

(57) ABSTRACT

A method of reducing warp imparted to a silicon wafer having a (110) plane orientation and a <111> notch orientation by anisotropic film stress of a multilayer film that is to be formed on a surface of the silicon wafer, that includes forming the multilayer film on a surface of the silicon wafer in an orientation so that a direction in which the warp of the wafer will be greatest coincides with a direction in which Young's modulus of a crystal orientation of the silicon wafer is greatest. Also, a method of reducing warp imparted to a silicon wafer having a (111) plane orientation by isotropic film stress of a multilayer film to be formed on a surface of the silicon wafer, that includes, prior to forming the multilayer film, causing the silicon wafer to have an oxygen concentration of $8.0 \times 10^{17}$ atoms/cm$^3$ or more (ASTM F-121, 1979).

5 Claims, 5 Drawing Sheets

(52) U.S. Cl.
CPC ........ *H01L 21/0217* (2013.01); *H01L 21/022* (2013.01); *H01L 21/02211* (2013.01); *H01L 21/02274* (2013.01)

(56) References Cited

U.S. PATENT DOCUMENTS

| | | | |
|---|---|---|---|
| 2007/0128830 A1 | 6/2007 | Xie | |
| 2010/0032806 A1 | 2/2010 | Kihara et al. | |
| 2011/0073951 A1* | 3/2011 | Chatty | H01L 29/7845 257/E29.264 |
| 2012/0039786 A1 | 2/2012 | Von Ammon et al. | |
| 2014/0374771 A1* | 12/2014 | Umeno | H01L 29/201 438/16 |
| 2016/0203971 A1* | 7/2016 | Tsiang | H01L 21/0217 438/792 |

FOREIGN PATENT DOCUMENTS

| | | |
|---|---|---|
| JP | H9-266206 | 10/1997 |
| JP | WO 2003049189 A1 | 4/2005 |
| JP | 2008-140856 | 6/2008 |
| JP | 2010-034461 | 2/2010 |
| JP | 2012-39117 | 2/2012 |
| JP | 2015-88706 | 5/2015 |
| WO | 2013/137476 | 9/2013 |

OTHER PUBLICATIONS

ISR for PCT/JP2018/021721, dated Sep. 4, 2018.
IPRP for PCT/JP2018/021721, dated Jan. 14, 2020.
Written Opinion for PCT/JP2018/021721, dated Sep. 4, 2018.
El-Cat co, silicon wafer product page, www.el-cat.com/silicon-wafers-products.htm; retrieved Dec. 20, 2013 (Year: 2013) [note: Cited on Apr. 29, 2021 PTO-892 in parent app.].
Gaupner et al., "A study of Oxygen Precipitation in Heavily Doped Silicon" Portland State University, available at https://pdxscholar.library.pdx.edu/open_access_etds/1218/ (Year: 1989) [note: Cited on Sep. 10, 2021 PTO-892 in parent app.].

* cited by examiner

METHOD OF REDUCING WRAP IMPARTED TO SILICON WAFER BY SEMICONDUCTOR LAYERS

This is a Continuation of U.S. application Ser. No. 16/619,143, which is the U.S. National Stage of PCT/JP2018/021721, filed Jun. 6, 2018, which claims priority to JP 2017-134918, filed Jul. 10, 2017. The disclosure of each of these applications is herein incorporated by reference in its entirety.

TECHNICAL FIELD

The present invention relates to a silicon wafer serving as a substrate material for a semiconductor device and, more particularly, to a silicon wafer suitably used as a substrate material of a highly laminated semiconductor device such as a three-dimensional NAND flash memory (hereinafter, referred to as "3DNAND") and a processing method therefor.

BACKGROUND ART

A 3DNAND is recently attracting attention. The 3DNAND is a NAND memory formed by vertically stacking memory cell arrays and, by setting the number of layers (number of layers of a word line) to 64, a storage capacity as very large as 512 Gbit (64 GB) per single die can be achieved. Further, not by increasing density in a planar direction as in a conventional planar type NAND memory, but by increasing density in a height direction, it is possible to provide a high performance flash memory which is excellent not only in capacity, but also in writing speed and power saving.

In the manufacture of a semiconductor device, films of various materials such as an oxide film, a nitride film, and a metal film are laminated on a silicon wafer so as to form a device structure. These laminated films have different film stresses depending on a film property and formation process conditions, which may produce a warp in the silicon wafer. Particularly, the 3DNAND is formed by vertically stacking several tens or more of memory elements, so that, correspondingly the number of laminated films increases geometrically, with the result that the film stress enormously increases in proportion to the increase in the number of the laminated films, and this significantly increases the warpage of the silicon wafer. A large warp of the silicon wafer during a device process causes troubles that prevent processing in the subsequent processes, such as film formation, processing and inspection from being performed properly.

Regarding the manufacture of a semiconductor device having three or more wiring layers, Patent Document 1, for example, describes a semiconductor device manufacturing method capable of reducing the warpage of a silicon substrate to equal to or less than a predetermined value without depending on the type of a fabrication apparatus to be used and without using a special interlayer film forming process. In this manufacturing method, assuming that the thickness of a silicon substrate is T (μm)), the diameter thereof is D (inch), and the number of wiring layers is n, a silicon substrate satisfying $T \geq 62.4 \times D \times [1.6(n-1)+1.0]^{1/2}$ is used to manufacture a semiconductor device.

Further, Patent Documents 2 and 3 describe a method of manufacturing an epitaxial silicon wafer having high flatness by forming an epitaxial layer on the surface of a silicon wafer for epitaxial growth having a bowl-shaped warp (having a concave at the center thereof).

Background Art Literature

Patent Document

Patent Document 1: Japanese Patent Application Laid-Open No. H09-266206
Patent Document 2: Japanese Patent Application Laid-Open No. 2008-140856
Patent Document 3: Japanese Patent Application Laid-Open No. 2010-034461

SUMMARY OF THE INVENTION

Problems to be Solved by the Invention

However, the semiconductor device manufacturing method described in Patent Document 1 assumes that the film stress of the wiring layer is not varied, and the formation process dependency of the film stress is ignored. Actually, the film stress varies dependent on the formation process conditions, so that the amount of warpage cannot be evaluated only from the number of wiring layers. Thus, it is difficult to apply this manufacturing method. Further, when the number of wiring layers is set to 500 in a 12-inch silicon wafer, it is enough, according to the above formula, to satisfy the thickness T of the silicon wafer ≥777.1 μm, which, however, is substantially equal to the standard thickness (775 μm) of the 12-inch wafer and, thus, it is clear that the effect of suppressing the warping cannot be expected.

Further, the technique described in Patent Documents 2 and 3 is a method of forming an initial wafer which is warped beforehand for reducing the warp of a wafer after epitaxial growth and is not a method of reducing the warp of the wafer during a device process. That is, even if a wafer is warped due to the formation of a semiconductor device layer on such an epitaxial wafer, it is impossible for the epitaxial wafer itself to reduce the warp. Further, even if an epitaxial growth process is regarded as a part of a device process, it is not clear how to calculate the warp amount of a shape to be formed based on the warp amount to be reduced. Furthermore, the technique described in Patent Documents 2 and 3 can be applied only to a case where a wafer is warped in a bowl shape and cannot be applied to a case where a wafer is warped in a saddle shape.

The specifications such as the thickness, shape and crystal orientation of a silicon wafer are specified in advance independent of the amount or shape of the warp. Thus, even when the warp occurs in the silicon wafer during a device process, it is impossible to cope with the warp of the wafer because of the absence of the criterion for specification change of the silicon wafer.

The object of the present invention is therefore to provide a silicon wafer capable of reducing the warp of the wafer occurring during a manufacturing process of a semiconductor device such as a 3DNAND and allowing the subsequent processes, which could suffer from problems due to a large warp of the wafer, to be carried out without problems, and a processing method therefor.

Means for Solving the Problem

To solve the above problems, a silicon wafer according to the present invention is a silicon wafer in which there is formed a multilayered film constituting a semiconductor device layer on one main surface thereof in a device process, which is warped in a bowl shape due to an isotropic film stress of the multilayered film, and which has a (111) plane orientation.

By using a (111) silicon wafer having small orientation dependency of a warp when a wafer is warped in a bowl shape in a device process, it is possible to enhance an effect of reducing the bowl-shaped warp. Thus, there can be provided a silicon wafer allowing the subsequent processes, which could suffer from problems due to a large warp of the wafer, to be carried out smoothly.

The oxygen concentration of the silicon wafer according to the present invention is preferably $8.0 \times 10^{17}$ atoms/cm$^3$ or more (ASTM F-121, 1979) The Young's modulus of a silicon crystal is improved as the oxygen concentration in a crystal increases, so that a warp reduction effect can be enhanced.

In the present invention, the semiconductor device layer preferably includes a 3DNAND flash memory. As described above, in the 3DNAND flash memory, the number of stacked memory cell arrays is very large, so that the problem of the wafer warp is conspicuous. That is, when the number of layers increases along with advance of a device process, the wafer warp also increases, and the warp amount exceeds an allowable range before stacking of the topmost layer, which may make it impossible to advance the device process further. However, according to the present invention, countermeasures against warping are taken for a device still in a wafer state, so that the problem of the warp can be solved, thus avoiding the situation where it is impossible to advance the device process further.

Further, a silicon wafer according to the present invention is a silicon wafer in which there is formed a multilayered film constituting a semiconductor device layer on one main surface thereof in a device process, which is warped in a saddle shape due to an anisotropic film stress of the multilayered film, and which has a (110) plane orientation and a <111> notch orientation.

By using a silicon wafer in which the plane orientation having a large orientation dependency of the warp is (110) and the notch direction is <111> when a wafer is warped in a saddle shape in a device process, it is possible to make a direction in which the warp of the wafer becomes large coincide with the direction of a crystal orientation in which Young's modulus is large, whereby an effect of reducing the saddle-shaped warp can be enhanced. Thus, there can be provided a silicon wafer allowing the subsequent processes, which could suffer from problems due to a large warp of the wafer, to be carried out smoothly.

The oxygen concentration of the silicon wafer according to the present invention is preferably $6.0 \times 10^{17}$ atoms/cm$^3$ or more (ASTM F-121, 1979). The Young's modulus of a silicon crystal is improved as the oxygen concentration in a crystal increases, so that a warp reduction effect can be enhanced.

In the present invention, the semiconductor device layer preferably includes a 3DNAND flash memory. As described above, in the 3DNAND flash memory, the number of stacked memory cell arrays is very large, so that the problem of the wafer warp is conspicuous. That is, when the number of layers increases along with advance of a device process, the wafer warp also increases, and the warp amount exceeds an allowable range before stacking of the topmost layer, which may make it impossible to advance the device process further. However, according to the present invention, countermeasures against warping are taken for a device still in a wafer state, so that the problem of the warp can be solved, thus avoiding the situation where it is impossible to advance the device process further.

A silicon wafer processing method according to the present invention includes: preparing a silicon wafer having a (111) plane orientation; and forming a multilayered film constituting a semiconductor device layer on one main surface of the silicon wafer, wherein a bowl-shaped warp generated due to an isotropic film stress of the multilayered film is suppressed. According to the present invention, it is possible to suppress the wafer warpage due to the film stress in a device process.

Further, a silicon wafer processing method according to the present invention includes: preparing a silicon wafer having a (110) plane orientation and a <111> notch orientation; and forming a multilayered film constituting a semiconductor device layer on one main surface of the silicon wafer, wherein the direction of a saddle-shaped warp generated due to an anisotropic film stress of the multilayered film is made to coincide with the notch orientation to suppress the saddle-shaped warp. According to the present invention, it is possible to suppress the wafer warpage due to the film stress in a device process.

Effects of the Invention

According to the present invention, there can be provided a silicon wafer manufacturing method capable of reducing the warpage of the wafer occurring during a device process and allowing the subsequent processes, which could suffer from problems due to a large warp of the wafer, to be carried out without problems.

DETAILED DESCRIPTION OF THE EMBODIMENTS

Hereinafter, preferred embodiments of the present invention will be described with reference to the accompanying drawings.

Figure 1:
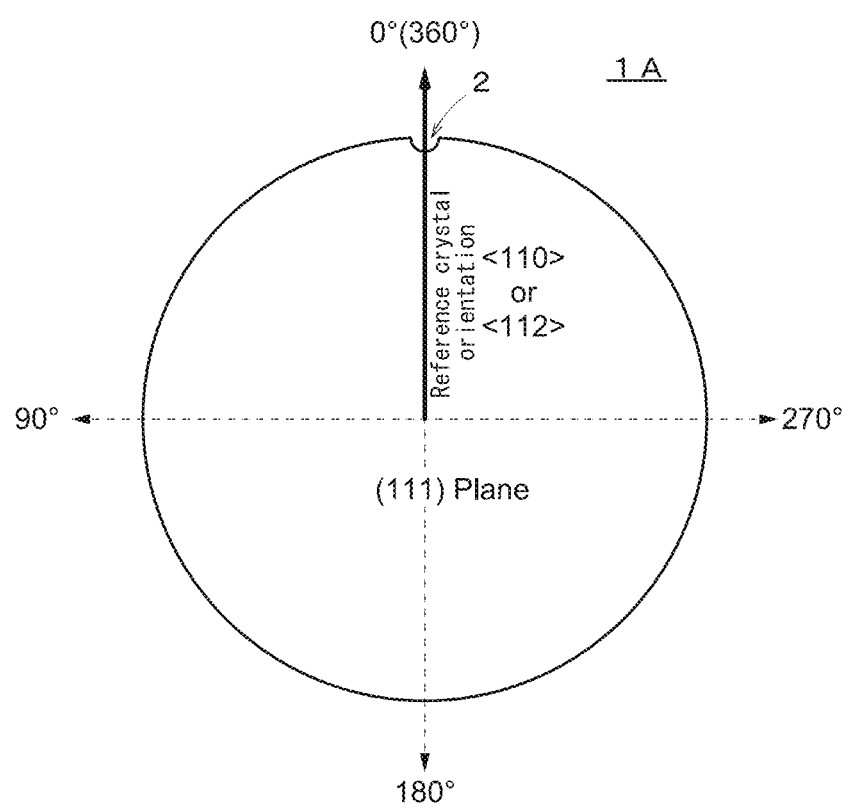
FIG. 1 is a schematic plan view illustrating the configuration of a silicon wafer according to a first embodiment of the present invention.

FIG. 1 is a schematic plan view illustrating the configuration of a silicon wafer according to a first embodiment of the present invention.

As illustrated in FIG. 1, a silicon wafer 1A is a silicon wafer for a highly laminated semiconductor device in which there is formed a multilayered film constituting a semiconductor device layer, such as a 3DNAND flash memory, on one main surface thereof in a device process and which is warped in a bowl shape due to an isotropic film stress of the multilayered film. The plane orientation of the silicon wafer 1A is (111), and the notch orientation thereof is <110> or <112>. That is, a notch 2 is formed in a <110> or <112> direction.

The oxygen concentration of the silicon wafer 1A is preferably $8.0 \times 10^{17}$ atoms/cm$^3$ or more (ASTM F-121, 1979). The Young's modulus of a (111) silicon wafer has oxygen concentration dependency, and thus it is possible to enhance warp reduction effect when the oxygen concentration is $8.0 \times 10^{17}$ atoms/cm$^3$ or more.

Figure 2:
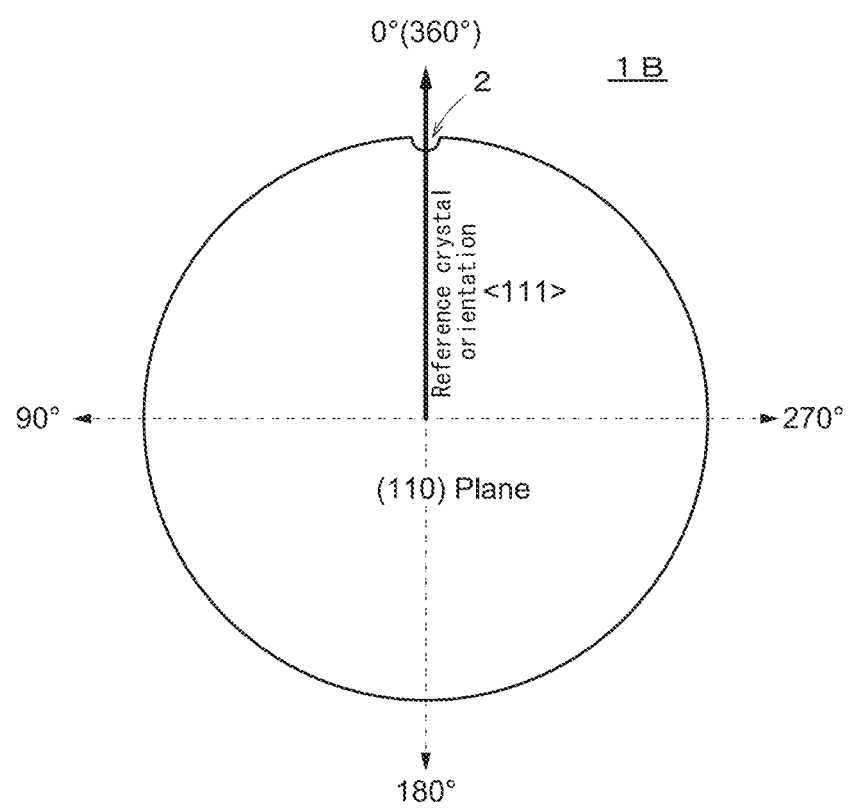
FIG. 2 is a schematic plan view illustrating the configuration of a silicon wafer according to a second embodiment of the present invention.

FIG. 2 is a schematic plan view illustrating the configuration of a silicon wafer according to a second embodiment of the present invention.

As illustrated in FIG. 2, a silicon wafer 1B is a silicon wafer for a highly integrated semiconductor device in which there is formed a multilayered film constituting a semiconductor device layer on one main surface thereof in a device process and which is warped in a saddle shape due to an anisotropic film stress of the multilayered film. The plane orientation of the silicon wafer 1B is (110), and the notch orientation thereof is <111>. That is, a notch 2 is formed in a <111> direction.

The oxygen concentration of the silicon wafer 1B is preferably $6.0 \times 10^{17}$ atoms/cm$^3$ or more (ASTM F-121, 1979). The Young's modulus of a (110) silicon wafer has oxygen concentration dependency, and thus it is possible to enhance the warp reduction effect when the oxygen concentration is $6.0 \times 10^{17}$ atoms/cm$^3$ or more.

Figure 3:
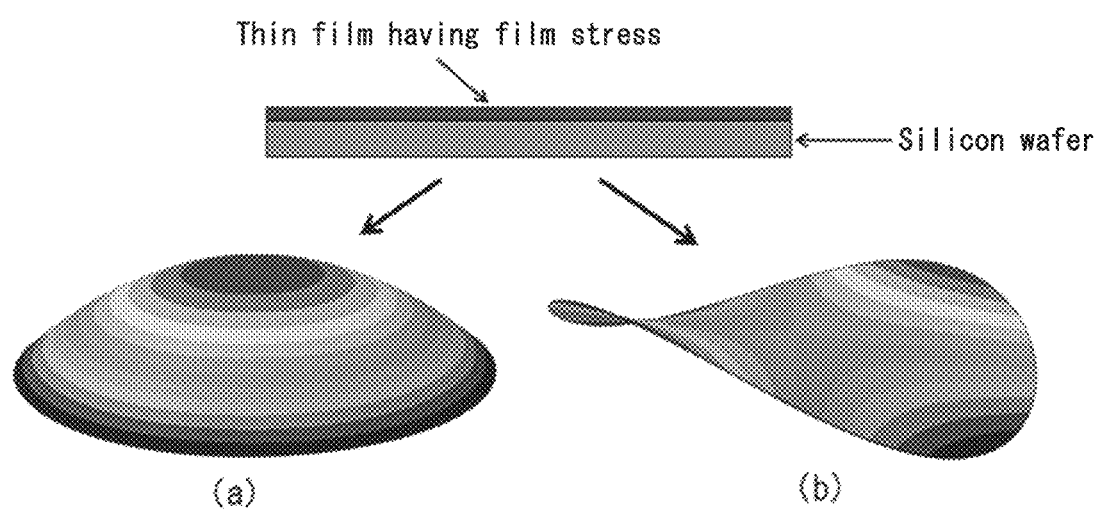
FIG. 3 is a schematic view for explaining the type of warp generated when a film stress is applied to a flat silicon wafer, in which (a) illustrates a bowl-shaped warp, and (b) illustrates a saddle-shaped warp.

FIG. 3 is a schematic view for explaining the type of warp generated when a film stress is applied to a flat silicon wafer, in which (a) illustrates a bowl-shaped warp, and (b) illustrates a saddle-shaped warp.

The silicon wafer can be warped in a bowl shape or a saddle shape. When an isotropic film stress is applied to a flat silicon wafer, a bowl-shaped warp is generated as illustrated in FIG. 3(a); while when an anisotropic film stress is applied to a flat silicon wafer, a saddle-shaped warp is generated as illustrated in FIG. 3(b). The bowl shape refers to a shape in which the entire outer periphery of the wafer is displaced upward or downward relative to the center portion of the wafer. The saddle shape refers to a shape in which both end portions of the wafer in one of the X- and Y-directions thereof are displaced upward (or downward) relative to the center portion of the wafer and both end portions in other one of the X- and Y-directions are displaced downward (or upward) relative to the center portion.

The bowl shape refers to a shape in which the entire outer periphery of the wafer is displaced upward or downward relative to the center portion of the wafer. The saddle shape refers to a shape in which both end portions of the wafer in one of the X- and Y-directions thereof are displaced upward (or downward) relative to the center portion of the wafer and both end portions in other one of the X- and Y-directions are displaced downward (or upward) relative to the center portion.

Figure 4:
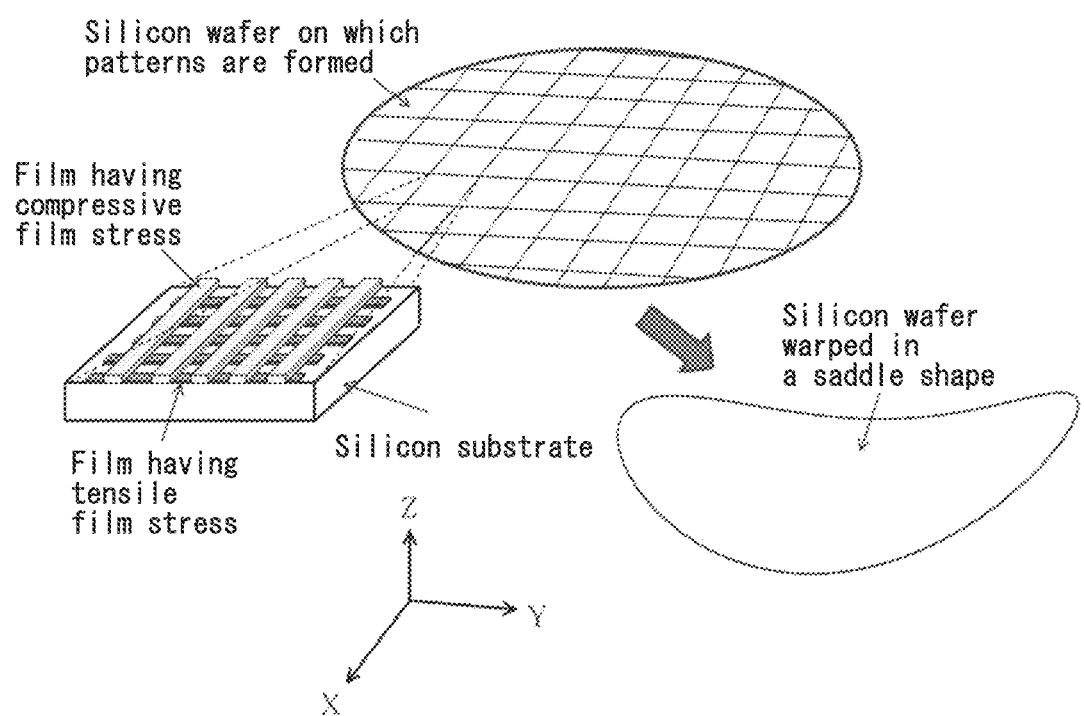
FIG. 4 is a schematic view for explaining a difference in how the wafer is warped due to a film stress applied to the silicon wafer.

FIG. 4 is a schematic view for explaining a difference in how the wafer is warped due to a film stress applied to the silicon wafer.

As illustrated in FIG. 4, when a laminated film such as a wiring layer constituting a semiconductor device is formed on the surface of the silicon wafer, a film stress is generated in the silicon wafer, whereby a bowl-shaped warp as illustrated in (a) or a saddle-shaped warp as illustrated in (b) is generated. When such a warp of the wafer increases, various problems arise in the subsequent processes.

The reason that the silicon wafer is warped into a saddle shape during a device process is that the signs of the film stresses of the films formed on the silicon wafer differ from each other to generate anisotropy of the film stress. For example, as illustrated in FIG. 4, when, in addition to a wiring layer in which a compressive stress in the X-direction is dominant, a wiring layer having a tensile stress in the Y-direction perpendicular to the X-direction is formed, the compressive stress in the X-direction is intensified, with the result that the silicon wafer is warped in a saddle shape.

The Young's modulus of a silicon crystal varies depending on a crystal orientation, that is, it has orientation dependency. Specifically, the Young's modulus of a silicon crystal is 130 MPa in a [100] direction, 170 MPa in a [110] direction, and 189 MPa in a [111] direction. The smaller the Young's modulus is, the easier deformation occurs. When the wafer is warped in a saddle shape, coincidence between a direction in which the warp is maximum and the direction of a crystal orientation in which Young's modulus is small makes the wafer more apt to be warped to increase the warp amount. Conversely, coincidence between the direction in which the warp is maximum and the direction of a crystal orientation in which Young's modulus is large makes the wafer less likely to be warped to reduce the warp amount.

Thus, in the present embodiment, when the wafer is warped in a saddle shape in a device process, the silicon wafer 1B in which the plane orientation having a large orientation dependency of the warp is (110) and the notch direction is <111> is used (see FIG. 2). Normally, a semiconductor device is formed in accordance with the notch direction in a device process, so that by matching the direction of the wiring layer to the notch direction, it is possible to make a direction in which the warp of the wafer becomes large coincide with the direction of a crystal orientation in which Young's modulus is large, whereby an effect of reducing the saddle-shaped warp can be enhanced.

Further, when the wafer is warped in a bowl shape in a device process, the silicon wafer 1A in which the plane orientation having no orientation dependency of the warp is (111) is used (see FIG. 1). By making the Young's modulus of the silicon wafer isotropic in conformity to the isotropic film stress to be applied in a device process, an effect of reducing the bowl-shaped warp can be enhanced.

While the present invention has been described based on the preferred embodiment, the present invention is not limited to the above embodiment, and various modifications may be made within the scope of the present invention. Accordingly, all such modifications are included in the present invention.

For example, although the silicon wafer manufacturing method suitable for manufacture of a 3DNAND has been described in the above embodiment, the present invention is not limited to this but may be applied to silicon wafers for various semiconductor devices in which the wafer may be warped due to the film stress.

EXAMPLES

Example 1

Silicon wafer samples #1 to #16 having different plane orientations and different notch orientations were prepared. Each of the wafer samples was grown by a CZ method and had a diameter of 300 mm and a thickness of 775 μm. The plane orientations of the wafer samples were of three types of (100), (110), and (111). The notch orientation of the wafer having the (100) plane orientation included two types of <110> and <100>. The notch orientation of the wafer having the (110) plane orientation included two types of <110> and <111>. The notch orientation of the wafer having the (111) plane orientation included two types of <110> and <112>. Variations in both the plane orientation and notch orientation among the wafers used were within ±1°.

Then, the oxygen concentration of each wafer was measured. The oxygen concentration was measured using a Fourier transform infrared spectroscopy (FT-IR) defined in ASTM F-121, 1979.

Then, a silicon oxide film having a thickness of 2 μm was formed on the main surfaces of the wafer samples #1 to #16 by a CVD process. As a result, a convex bowl-shaped warp was generated. The measurement results concerning the warp amounts (WARP) of the wafer samples are shown in Table 1.

TABLE 1

| Wafer sample | Wafer plane orientation | Notch orientation | Oxygen concentration ($\times 10^{17}$ atoms/cm$^3$) | Warp amount (μm) |
|---|---|---|---|---|
| #1 | (100) | <110> | 8.5 | 612 |
| #2 | (100) | <110> | 13.2 | 608 |
| #3 | (100) | <100> | 8.4 | 611 |
| #4 | (100) | <100> | 13.0 | 605 |
| #5 | (110) | <110> | 7.2 | 789 |
| #6 | (110) | <110> | 12.9 | 762 |
| #7 | (110) | <111> | 8.2 | 785 |
| #8 | (110) | <111> | 13.5 | 765 |
| #9 | (111) | <110> | 6.3 | 507 |
| #10 | (111) | <110> | 8.1 | 451 |
| #11 | (111) | <110> | 10.6 | 443 |
| #12 | (111) | <110> | 12.5 | 441 |
| #13 | (111) | <110> | 13.8 | 448 |
| #14 | (111) | <112> | 6.0 | 501 |
| #15 | (111) | <112> | 8.2 | 436 |
| #16 | (111) | <112> | 11.9 | 440 |

As is clear from Table 1, in the wafer samples #1 to #4 having the (100) plane orientation, a large warp of about 600 μm is generated irrespective of the substrate oxygen concentration and notch orientation.

In the wafer samples #5 to #8 having the (110) plane orientation, a large warp of about 770 μm is generated irrespective of the substrate oxygen concentration and notch orientation. Although the warp amount is smaller as the oxygen concentration becomes higher, there is found no significant difference.

In the wafer samples #9 to #16 having the (111) plane orientation, the warp amount is reduced as compared to the wafers having the (100) and (110) plane orientations, irrespective of the notch orientation. Further, the wafer warp has oxygen concentration dependency, and the warp reduction effect is particularly high when the oxygen concentration is $8.0 \times 10^{17}$ atoms/cm$^3$ or more. This is presumably because increase in the oxygen concentration improves the Young's modulus of a silicon crystal.

The Young's modulus of a silicon crystal has orientation dependency in which it varies depending on the crystal orientation, so that when such a film stress with little anisotropy as to cause a bowl-shaped warp is applied, resistance to deformation is thought to be changed depending on the plane orientation. From the above results, it can be said that it is possible to suppress the warp to be a problem in a device process by using the (111) wafer.

Example 2

As in Example 1, silicon wafer samples #17 to #31 having different plane orientations and different notch orientations were prepared, and the oxygen concentrations thereof were measured.

Figure 5:
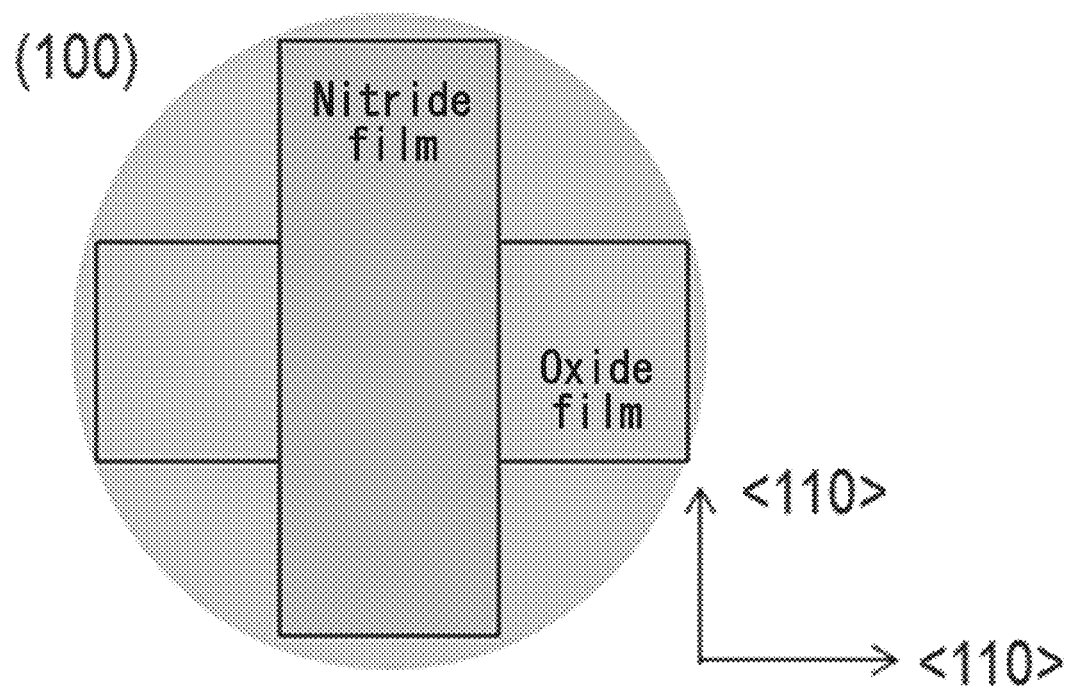
FIG. 5 is a schematic perspective view illustrating an example of a film formation pattern that applies an anisotropic film stress to a silicon wafer.

Then, a silicon oxide film having a thickness of 1 μm was formed on the main surfaces of the wafer samples #17 to #31 by a CVD process, followed by partial etching using a mask, and then a silicon nitride film having a thickness of 0.7 μm was formed by a CVD process, followed by partial etching using a mask, whereby a film as illustrated in FIG. 5 was produced. For example, in a (100) wafer of sample #17, the silicon oxide film has a rectangular pattern elongated in a <110> direction, and the silicon nitride film has a rectangular pattern elongated in a direction perpendicular to the longitudinal direction of the silicon oxide film. By the pattern obtained by synthesizing the silicon oxide and nitride patterns, an anisotropic film stress is generated in the silicon wafer, causing a saddle-shaped warp. The measurement results concerning the warp amounts (WARP) of the wafer samples are shown in Table 2.

TABLE 2

| Wafer sample | Wafer plane orientation | Notch orientation | Oxygen concentration ($\times 10^{17}$ atoms/cm$^3$) | Warp amount (μm) |
|---|---|---|---|---|
| #17 | (100) | <110> | 5.7 | 478 |
| #18 | (100) | <110> | 13.1 | 464 |
| #19 | (100) | <100> | 5.5 | 618 |
| #20 | (100) | <100> | 13.3 | 621 |
| #21 | (110) | <110> | 5.7 | 553 |
| #22 | (110) | <110> | 7.8 | 559 |
| #23 | (110) | <110> | 12.9 | 552 |
| #24 | (110) | <111> | 5.6 | 398 |
| #25 | (110) | <111> | 6.3 | 325 |
| #26 | (110) | <111> | 10.9 | 318 |
| #27 | (110) | <111> | 12.9 | 312 |
| #28 | (111) | <110> | 5.4 | 513 |
| #29 | (111) | <110> | 12.1 | 520 |
| #30 | (111) | <112> | 5.9 | 516 |
| #31 | (111) | <112> | 12.3 | 512 |

As is clear from Table 2, in the wafer samples #17 to #20 having the (100) plane orientation, the warp amount varies depending on the substrate oxygen concentration or notch orientation. Particularly, the warp reduction effect is higher in the <110> notch than in the <100> notch. However, the <110> notch of the (100) wafer is the standard orientation of a wafer.

In the wafer samples #21 to #27 having the (110) plane orientation, the warp amount varies depending on the substrate oxygen concentration or notch orientation. Particularly, the warp reduction effect is high in the <111> notch. Further, among the wafer samples #24 to #27 having the <111> notch, the samples #25, #26, and #27 having an oxygen concentration of $6 \times 10^{17}$ atoms/cm$^3$ or more have a particularly high warp reduction effect.

In the wafer samples #28 to #31 having the (111) plane orientation, a large warp of about 500 μm is generated irrespective of the substrate oxygen concentration and notch orientation. However, the <110> notch of the (111) wafer is the standard orientation of a wafer.

DESCRIPTION OF THE SYMBOLS 1A, 1B Silicon wafer
2 notch

What is claimed is:
1. A method of reducing an amount of warp imparted to a silicon wafer having a (110) plane orientation and a <111> notch orientation by anisotropic film stress of a multilayer film that is to be formed on a surface of the silicon wafer, the method comprising:

forming the multilayer film on a surface of the silicon wafer in an orientation so that a direction in which the warp of imparted to the wafer will be greatest coincides with a direction in which Young's modulus of a crystal orientation of the silicon wafer is greatest.

2. The method of claim 1, wherein the silicon wafer has an oxygen concentration of $6.0\times10^{17}$ atoms/cm$^3$ or more (ASTM F-121, 1979) prior to forming the multilayer film.

3. The method of claim 1, wherein the multilayer film is for a semiconductor device layer that includes a 3DNAND flash memory.

4. A method of reducing an amount of warp imparted to a silicon wafer having a (111) plane orientation by isotropic film stress of a multilayer film that is to be formed on a surface of the silicon wafer, the method comprising:

prior to forming the multilayer film, causing the silicon wafer to have an oxygen concentration of $8.0\times10^{17}$ atoms/cm$^3$ or more and $10.6\times10^{17}$ atoms/cm$^3$ or less (ASTM F-121, 1979).

5. The method of claim 4, wherein the multilayer film is for a semiconductor device layer that includes a 3DNAND flash memory.

* * * * *

UNITED STATES PATENT AND TRADEMARK OFFICE
CERTIFICATE OF CORRECTION

PATENT NO. : 12,004,344 B2
APPLICATION NO. : 17/541767
DATED : June 4, 2024
INVENTOR(S) : Ono et al.

Page 1 of 1

It is certified that error appears in the above-identified patent and that said Letters Patent is hereby corrected as shown below:

In the Claims

Column 9, Line 6 (Claim 1), change "warp of imparted" to -- warp imparted --.

Signed and Sealed this
Eighth Day of October, 2024

Katherine Kelly Vidal
*Director of the United States Patent and Trademark Office*